(12) United States Patent
Shi et al.

(10) Patent No.: US 8,878,605 B2
(45) Date of Patent: Nov. 4, 2014

(54) AMPLIFIER CIRCUIT INCLUDING DIGITAL AMPLIFIER AND ANALOG AMPLIFIER

(71) Applicant: Fujitsu Limited, Kawasaki (JP)

(72) Inventors: Huan Shi, Kawasaki (JP); Hisanori Murata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/200,067

(22) Filed: Mar. 7, 2014

(65) Prior Publication Data

US 2014/0184332 A1     Jul. 3, 2014

Related U.S. Application Data

(63) Continuation of application No. PCT/JP2011/071906, filed on Sep. 26, 2011.

(51) Int. Cl.
*H03F 1/14* (2006.01)

(52) U.S. Cl.
USPC ............................ 330/51; 330/124 R; 330/295

(58) Field of Classification Search
USPC ........................................ 330/51, 295, 124 R
IPC ................................................................ H03F 1/14
See application file for complete search history.

(56) References Cited

U.S. PATENT DOCUMENTS

| | | | |
|---|---|---|---|
| 5,889,392 A | 3/1999 | Moore et al. | |
| 6,229,390 B1 | 5/2001 | Delano et al. | |
| 6,567,653 B1* | 5/2003 | Sanders | 455/126 |
| 2011/0074504 A1* | 3/2011 | Jang | 330/124 R |

FOREIGN PATENT DOCUMENTS

| | | |
|---|---|---|
| JP | 61-292407 | 12/1986 |
| JP | 07-142934 | 6/1995 |
| JP | 2002-539660 | 11/2002 |
| JP | 2007-096507 | 4/2007 |

OTHER PUBLICATIONS

International Search Report, mailed in connection with PCT/JP2011/071906 and mailed Dec. 27, 2011.

* cited by examiner

*Primary Examiner* — Patricia Nguyen
(74) *Attorney, Agent, or Firm* — Fujitsu Patent Center

(57) ABSTRACT

An amplifier circuit includes a digital amplifier configured to amplify an input signal to output a first output signal, an analog amplifier configured to amplify the input signal to output a second output signal, a check circuit configured to produce a check signal responsive to frequencies of the input signal, and a selector circuit configured to select and output one of the first output signal and the second output signal in response to the check signal.

9 Claims, 12 Drawing Sheets

AMPLIFIER CIRCUIT INCLUDING DIGITAL AMPLIFIER AND ANALOG AMPLIFIER

CROSS-REFERENCE TO RELATED APPLICATIONS

This application is a continuation application of International Application PCT/JP2011/071906 filed on Sep. 26, 2011 and designated the U.S., the entire contents of which are incorporated herein by reference.

FIELD

The disclosures herein generally relate to amplifiers, and particularly relate to an amplifier circuit including a digital amplifier.

BACKGROUND

A digital amplifier generally include a pulse modulation unit, a switching unit, and a low-pass filter unit. The pulse modulation unit modulates a pulse signal in response to an input analog signal such that a ratio of the "0"-level period and the "1"-level period of the output pulse signal is responsive to the voltage level of the input analog signal. The switching unit switches transistors in response to the output pulse signal of the pulse modulation unit to generate a power-amplified pulse signal. The low-pass filter unit performs low-pass filtering with respect to the amplified pulse signal to generate an amplified analog signal corresponding to the input analog signal.

Transistor elements in digital amplifiers are used in the fully turned-on state or in the fully turned-off state, which provides a higher power utilization efficiency than in the case of an analog amplifier which mainly uses the linear region of transistor elements. Digital amplifiers, however, have a problem of a slow rising response and a slow falling response due to the existence of the low-pass filter. Making higher the cutoff frequency of the low-pass filter for the purpose of achieving a faster rising response and a faster falling response will result in a noise increase. Because of such a tradeoff between response time and noise, it is difficult to increase response speed when taking into account the existence of noise.

The use of an analog amplifier can achieve a fast rising response and a fast falling response. The use of an analog amplifier, however, entails a low amplification efficiency, resulting in electric power being wasted.

U.S. Pat. No. 5,889,392 discloses a technology for addressing the problem that a DC-DC converter using a switching regulator cannot cope with a sudden change in load current because of the existence of the low-pass filter. This technology uses an additional circuit for speeding up an output-voltage transient response in the configuration in which the output voltage of an amplifier is fed back to allow the switching regulator to control the output voltage such that the output voltage is set equal to a desired reference voltage VREF. This speeding-up-purpose circuit includes a transistor to pull up the output voltage toward the power-supply voltage level and a transistor to pull down the output voltage toward the ground voltage level. The output voltage deviating from VREF by more than ±2% results in a transistor being turned on, thereby swiftly bringing back the output voltage within a range of ±2-% around VREF.

The circuit configuration disclosed in the above-noted U.S. patent drives the speeding-up-purpose circuit in response to the detected value of the output voltage to cause the output voltage to rapidly change. However, in the digital amplifier whose input voltage and output voltage are supposed to change, it is not appropriate to drive a speeding-up-circuit based on the detected value of the output voltage. Further, in the case that the constantly changing input voltage causes the output voltage to always fall outside the range of ±2-% around VREF, the speeding-up-purpose circuit ends up operating all the time, resulting in a poor efficiency.

SUMMARY

According to an aspect of the embodiment, an amplifier circuit includes a digital amplifier configured to amplify an input signal to output a first output signal, an analog amplifier configured to amplify the input signal to output a second output signal, a check circuit configured to produce a check signal responsive to frequencies of the input signal, and a selector circuit configured to select and output one of the first output signal and the second output signal in response to the check signal.

According to an aspect of the embodiment, a method of generating an output of an amplifier circuit, which includes a digital amplifier amplifying an input signal to produce a first output signal and an analog amplifier amplifying the input signal to produce a second output signal, includes generating a check signal responsive to frequencies of the input signal, and selecting, as the output of the amplifier circuit, one of the first output signal and the second output signal in response to the check signal.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments of the invention will be described with reference to the accompanying drawings.

Figure 1:
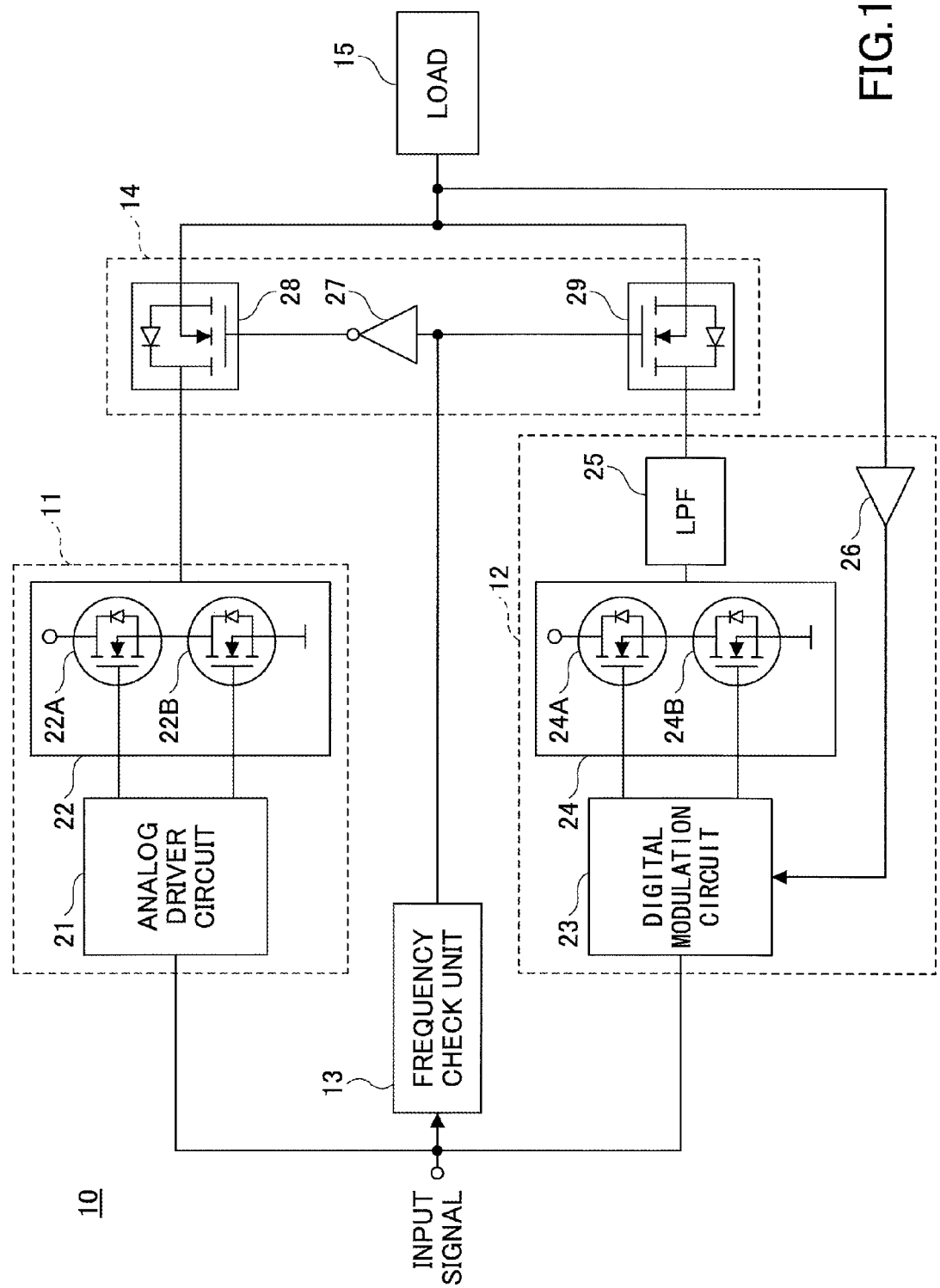
FIG. 1 is a drawing illustrating the configuration of a first embodiment of an amplifier circuit.

FIG. 1 is a drawing illustrating the configuration of a first embodiment of an amplifier circuit 10. The amplifier circuit 10 illustrated in FIG. 1 includes an analog amplifier 11, a digital amplifier 12, a frequency check unit 13, and a selector circuit 14. The analog amplifier 11 includes an analog driver circuit 21 and an amplifying element 22. The digital amplifier 12 includes a digital modulation circuit 23, a switch circuit 24, a low-pass filter (LFP) 25, and a buffer 26. The selector circuit 14 includes an inverter 27, an NMOS transistor 28, and an NMOS transistor 29. The output of the amplifier circuit 10 is connected to a load 15.

The digital amplifier 12 amplifies an input signal to output a first output signal. Specifically, the digital modulation circuit 23 generates a pulse signal having the pulse width thereof or the pulse density thereof changed in response to the input signal, i.e., generates a pulse-width-modulated or pulse-density-modulated pulse signal. In so doing, the digital modulation circuit 23 controls the pulse width or the pulse density such that a ratio of the "1"-level period and the "0"-level period of the pulse signal is set equal to a value responsive to the voltage value of the input analog signal. The modulation scheme employed here may perform pulse-width modulation by comparing the input signal with a triangular wave or a saw-tooth wave, or perform pulse-density modulation by use of delta-sigma modulation. In the configuration illustrated in FIG. 1, the output signal of the amplifier circuit 10 is supplied through the buffer 26 for use in feedback control that reduces noise in the digital amplifier 12. Such feedback control for noise reduction is not necessarily needed. The switch circuit 24 includes two NMOS transistors 24A and 24B that are series-connected. The gates of the NMOS transistors 24A and 24B receive a pulse signal and a signal that is an inverse thereof, respectively, which are output from the digital modulation circuit 23. In the case of the pulse signal being HIGH, the NMOS transistor 24A becomes conductive, resulting in the output of the switch circuit 24 being HIGH. In the case of the inverse of the pulse signal being HIGH, the NMOS transistor 24B becomes conductive, resulting in the output of the switch circuit 24 being LOW. In this manner, the switch circuit 24 generates an amplified pulse signal, which is then input into the low-pass filter 25. The low-pass filter 25 smoothes the amplified pulse signal to generate an output signal that is equivalent to a signal obtained by amplifying the input signal. This output signal is supplied as a first output signal of the digital amplifier 12 to the selector circuit 14.

The analog amplifier 11 amplifies an input signal to output a second output signal. Specifically, the analog driver circuit 21 drives the amplifying element 22 in response to the input signal. The amplifying element 22 includes NMOS transistors 22A and 22B. The gates of the NMOS transistors 22A and 22B receive signals from the analog driver circuit 21. For example, the analog driver circuit 21 may apply a voltage responsive to a bias voltage plus the input signal to the gate of the NMOS transistor 22A and also apply a voltage responsive to the bias voltage minus the input signal to the gate of the NMOS transistor 22B. With this configuration, the amplifying element 22 outputs a signal obtained by amplifying the input signal. This signal is supplied as a second output signal of the analog amplifier 11 to the selector circuit 14.

The frequency check unit 13 outputs a check signal responsive to the frequency of the input signal. The check signal is supplied to the selector circuit 14. The frequency check unit 13 may set the check signal to LOW when signal components higher than a predetermined frequency are present in the input signal and have amplitudes thereof larger than a predetermined amplitude. The frequency check unit 13 may set the check signal to HIGH when the signal components higher than the predetermined frequency have amplitudes thereof smaller than the predetermined amplitude.

In order to check the frequency components of the input signal, the frequency check unit 13 may perform signal processing that somehow approximates a frequency check. For example, the frequency check unit 13 may obtain a differential value of the input signal, and may output as the check signal an indication indicative of whether the absolute value of the differential value is smaller than a predetermined value. In so doing, the frequency check unit 13 may sample the input signal at predetermined intervals, and may obtain a difference between any given sampled value and an immediately preceding sampled value, followed by using such a difference as the differential value. Such a check based on the size of the derivative or differential value makes it possible to make a decision based on the size of a signal change occurring locally, thereby achieving in an approximating manner a check that is based on the local amplitudes of high frequency components.

The selector circuit 14 selects as an output thereof either the first output signal from the digital amplifier 12 or the second output signal from the analog amplifier 11 based on the check signal. Specifically, in the case of the check signal being LOW, the output of the inverter 27 is set to HIGH, so that the NMOS transistor 28 receiving at the gate thereof the output of the inverter 27 becomes conductive. In this state, the NMOS transistor 29 receiving at the gate thereof the check signal is non-conductive. With this arrangement, the check signal that is LOW results in the output of the amplifier circuit 10 being the second output signal supplied from the analog amplifier 11. In the case of the check signal being HIGH, the output of the inverter 27 is set to LOW, so that the NMOS transistor 28 receiving at the gate thereof the output of the inverter 27 becomes non-conductive. In this state, the NMOS transistor 29 receiving at the gate thereof the check signal is conductive. With this arrangement, the check signal that is HIGH results in the output of the amplifier circuit 10 being the first output signal supplied from the digital amplifier 12.

Figure 2:
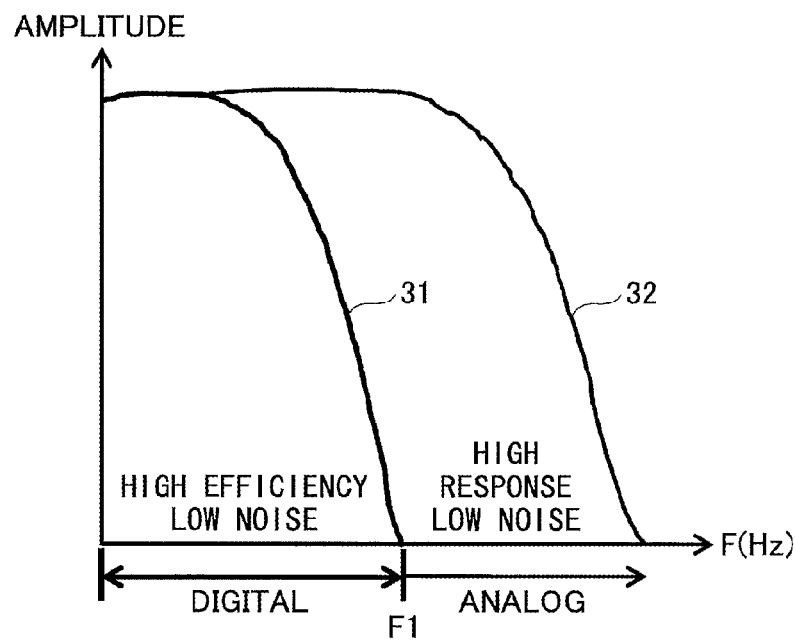
FIG. 2 is a drawing illustrating the operations of the amplifier circuit of FIG. 1.

FIG. 2 is a drawing illustrating the operations of the amplifier circuit of FIG. 1. In FIG. 2, the horizontal axis represents the frequency of the input signal into the amplifier circuit 10, and the vertical axis represents the amplitude of each frequency component (i.e., amplitude spectrum). In the case of the input signal having the amplitude spectrum as illustrated by a characteristic curve 31, i.e., in the case of the input signal having only the frequency components lower than a predetermined frequency F1, or in the case of the amplitudes of the signal components higher than the predetermined frequency F1 being significantly small, the first output signal of the digital amplifier 12 is selected. In the case of the input signal having the amplitude spectrum as illustrated by a characteristic curve 32, i.e., in the case of the amplitudes of the signal components higher than the predetermined frequency F1 being significantly large, the second output signal of the analog amplifier 11 is selected. In other words, the output of the analog amplifier 11 is selected when changes in the input signal are fast, and the output of the digital amplifier 12 is selected when changes in the input signal are slow. With this arrangement, the amplifier circuit 10 of FIG. 1 provides fast response characteristics for the input signal that requires a fast response, and provides a high power utilization efficiency for the input signal that does not require a fast response.

In the configuration illustrated in FIG. 1, both the analog amplifier 11 and the digital amplifier 12 are operating regardless of the result of the check made by the frequency check unit 13. It may be noted that the reason why power consumption is large in the analog amplifier 11 is because power is consumed when electric current flows through the transistors 22A and 22B of the amplifying element 22 operating in their linear region. When the output of the analog amplifier 11 is not connected to the load 15, thus, there is almost no power consumption in the transistors 22A and 22B. Despite the fact that both the analog amplifier 11 and the digital amplifier 12 are operating, the switching of the output signals as described above can provide an amplification operation having low power consumption, i.e., an amplification operation having a high power utilization efficiency. It may be noted that in the configuration illustrated in FIG. 1, the operation of the analog amplifier 11 or the operation of the digital amplifier 12 may be suspended in response to the check result made by the frequency check unit 13. This serves to further reduce power consumption.

Figure 3:
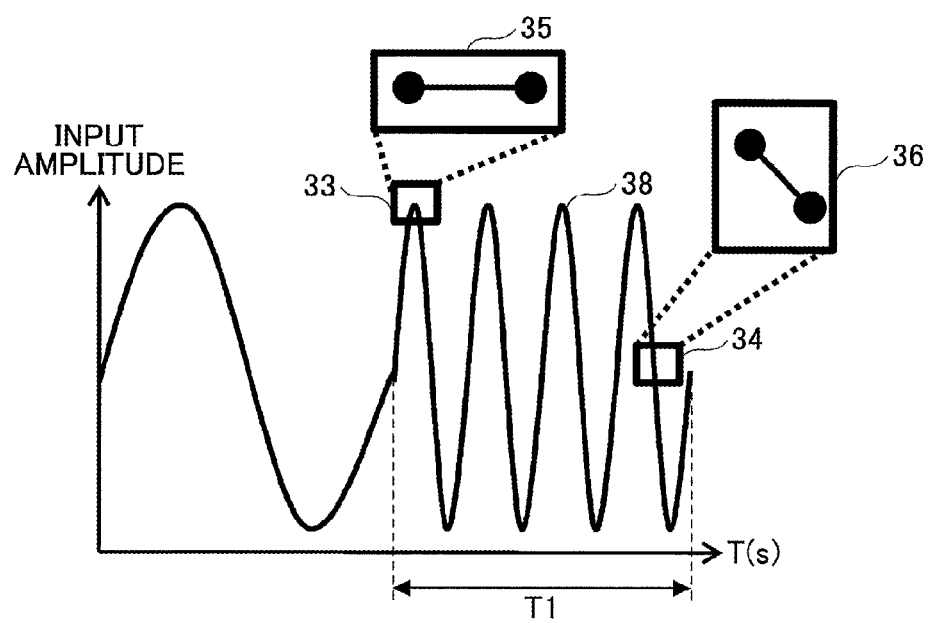
FIG. 3 is a drawing illustrating changes in the check signal when a check is made based on the size of signal changes that occur locally.

FIG. 3 is a drawing illustrating changes in the check signal when a check is made based on the size of signal changes that occur locally. In FIG. 3, the horizontal axis represents time, and the vertical axis represents the amplitude of an input signal. An input signal 38 exhibits a sinusoidal wave oscillation having a single frequency during a time period T1. In this case, the frequency check unit 13 illustrated in FIG. 1 produces an output that is a fixed, constant value during the time period T1 if the frequency check unit 13 operates as an ideal frequency check unit. In the case of the frequency of the input signal 38 during the time period T1 being such a frequency as resulting in the analog amplifier being selected, the check signal output from the frequency check unit 13 is fixed to LOW during the time period T1. In the case of the frequency of the input signal 38 during the time period T1 being such a frequency as resulting in the digital amplifier 12 being selected, the check signal output from the frequency check unit 13 is fixed to HIGH during the time period T1.

In contrast, in the case of the frequency check unit 13 making a check based on the size of local signal changes, the value of the check signal produced by the frequency check unit 13 ends up varying during the time period T1 in which the input signal 38 exhibits a single-frequency sinusoidal oscillation. At a point 33, two samples 35 of the input signal 38 adjacent to each other have almost the same value, resulting in the differential value being substantially zero. On the other hand, at a point 34, two samples 36 of the input signal 38 adjacent to each other have significantly different values, resulting in the differential value being large. A check signal indicative of whether the differential value is smaller than a predetermined value may be set to HIGH at the point 33 and may be set to LOW at the point 34 depending on the size of the predetermined value. As a result, the output of the digital amplifier 12 may be selected at peak points of the input signal 38 such as the point 33, and the output of the analog amplifier 11 may be selected at other points.

Figure 4:
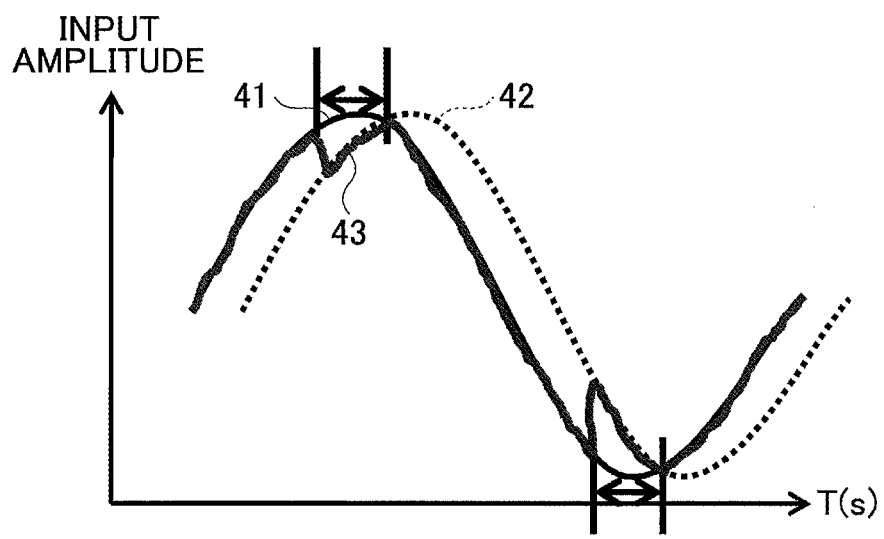
FIG. 4 is a drawing illustrating switching of the outputs of the amplifier circuit when a check is made based on the size of signal changes that occur locally.

FIG. 4 is a drawing illustrating switching of the outputs of the amplifier circuit when a check is made based on the size of signal changes that occur locally. In FIG. 4, the horizontal axis represents time, and the vertical axis represents the amplitude of an output signal. There is a phase difference between an output signal 41 of the analog amplifier 11 and an output signal 42 of the digital amplifier 12. This phase difference occurs due to the presence of the low-pass filter 25.

As was previously described, the output of the digital amplifier 12 may be selected around peak points of the input signal 38 such as the point 33 illustrated in FIG. 3, and the output of the analog amplifier 11 may be selected at other points. Upon occurrence of such a switching of amplifier outputs, an output 43 of the amplifier circuit 10 is equal to the output signal 41 of the analog amplifier 11 at points other than the peak points, and is equal to the output signal 42 of the digital amplifier 12 in the vicinity of the peak points as illustrated in FIG. 4. Consequently, the output of the amplifier circuit 10 ends up having a discontinuous waveform due to the phase difference between the output signal 41 of the analog amplifier 11 and the output signal 42 of the digital amplifier 12.

Figure 5:
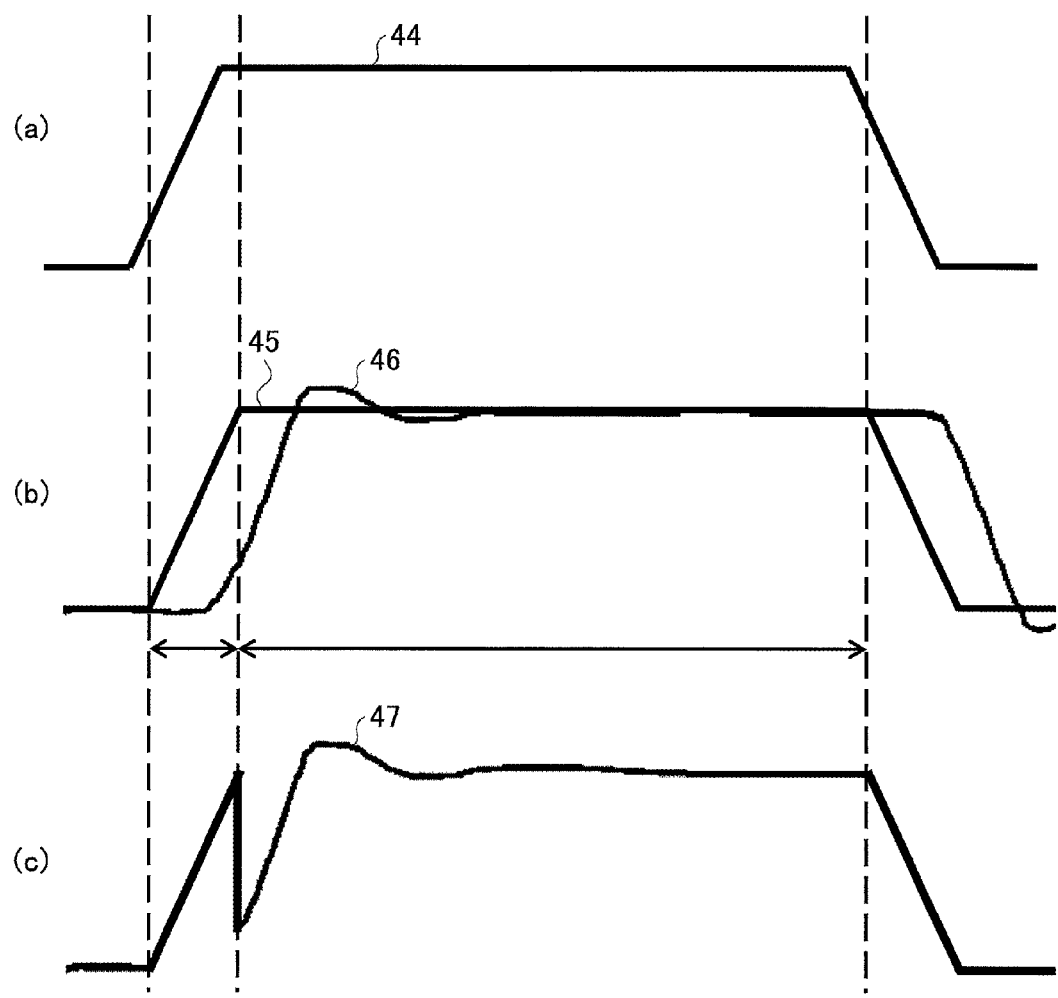
FIG. 5 is a drawing further illustrating switching of the outputs of the amplifier circuit when a check is made based on the size of signal changes that occur locally.

FIG. 5 is a drawing further illustrating switching of the outputs of the amplifier circuit when a check is made based on the size of signal changes that occur locally. In FIG. 5, the horizontal axis represents time, and the vertical axis represents the amplitude of an input signal or an output signal. FIG. 5-(a) illustrates an input signal 44. FIG. 5-(b) illustrates a second output signal 45 produced by the analog amplifier 11 in response to the input signal 44 and a first output signal 46 produced by the digital amplifier 12 in response to the input signal 44. The second output signal 45 produced by the analog amplifier 11 exhibits a sufficiently fast rising response and falling response, with a slight delay relative to the input signal 44. The first output signal 46 produced by the digital amplifier 12 rises with a significant delay relative to the input signal 44, and also exhibits a transient response such as an overshoot following the rise. FIG. 5-(c) illustrates an output signal waveform 47 of the amplifier circuit 10 when the output of the analog amplifier 11 and the output of the digital amplifier 12 are switched over based on the size of local signal changes in the input signal 44. The output signal 45 of the analog amplifier 11 is selected at the rising part of the input signal 44, and the output signal 46 of the digital amplifier 12 is selected when the input signal 44 stays constant following the rise thereof. As a result, the output signal waveform of the amplifier circuit 10 ends up being the discontinuous waveform 47 as illustrated in FIG. 5-(c).

In consideration of the above, provision may be made such that in order to make a check based on the size of signal changes, a time frame having a certain time length is set, and a signal change within this time frame may be detected to make such a check. With this arrangement, discontinuity in the output signal waveform as described above can be eliminated that appears when making a check based on the size of local signal changes. In a second embodiment that will be described in the following, a signal change within a time frame having a certain time length is detected to make a check.

Figure 6:
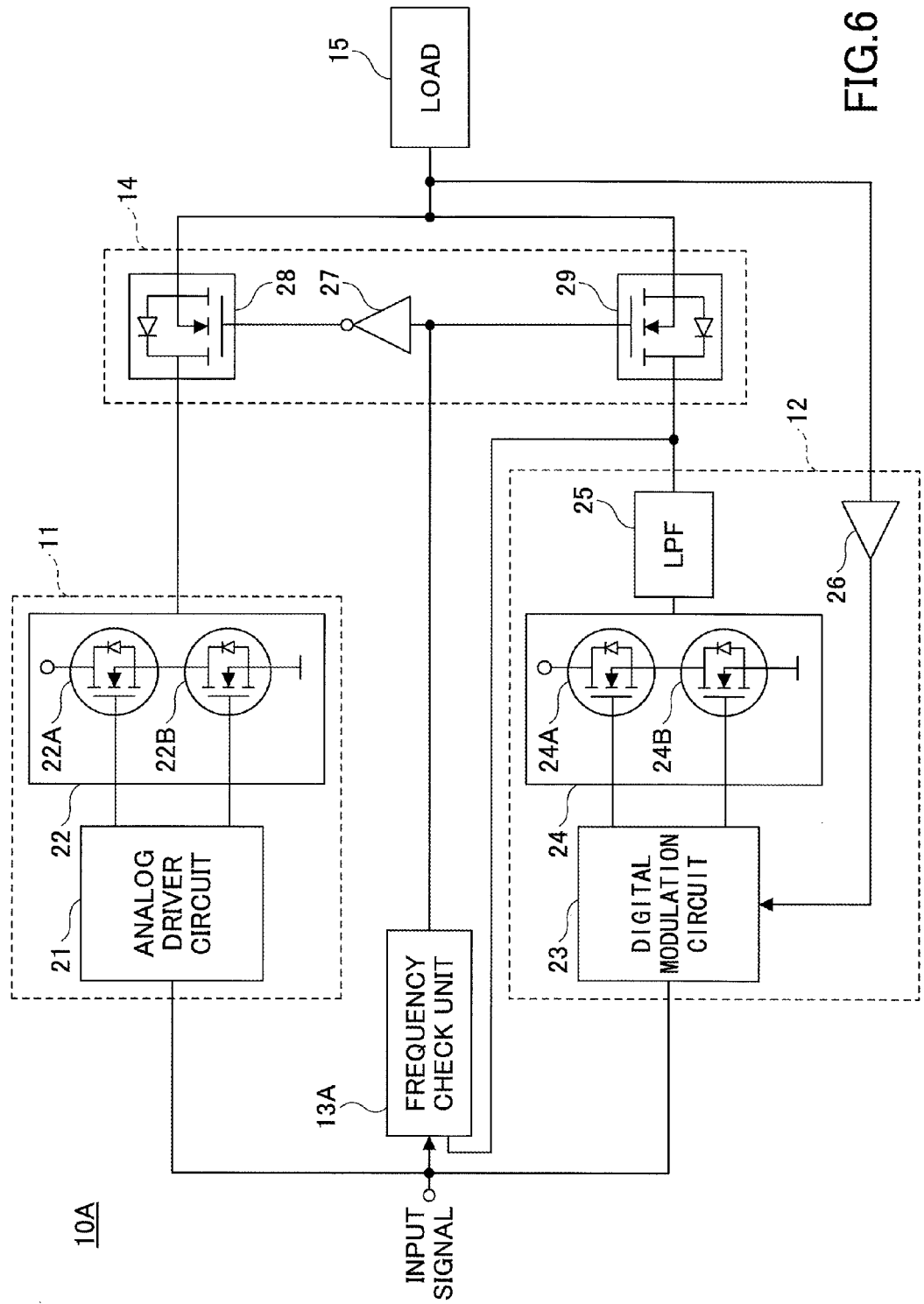
FIG. 6 is a drawing illustrating the configuration of a second embodiment of an amplifier circuit.

FIG. 6 is a drawing illustrating the configuration of a second embodiment of an amplifier circuit 2. In FIG. 6, the same or corresponding elements as those of FIG. 1 are referred to by the same or corresponding numerals, and a description thereof will be omitted as appropriate. An amplifier circuit 10A illustrated in FIG. 6 differs from the amplifier circuit 10 illustrated in FIG. 1 in that the first output signal of the digital amplifier 12 is supplied to a frequency check unit 13A. Along with this change, the frequency check unit 13A replaces the frequency check unit 13. Other configurations are the same between the amplifier circuit 10A illustrated in FIG. 6 and the amplifier circuit 10 illustrated in FIG. 1.

The frequency check unit 13A generates a check signal based on the input signal into the amplifier circuit 10A and the first output signal of the digital amplifier 12. For example, the frequency check unit 13A may generate a check signal based on a first check result indicative of whether the absolute value of a differential value of the input signal is smaller than a predetermined value and a second check result indicative of whether the absolute value of a differential value of the first output signal of the digital amplifier 12 is smaller than a predetermined value.

Figure 7:
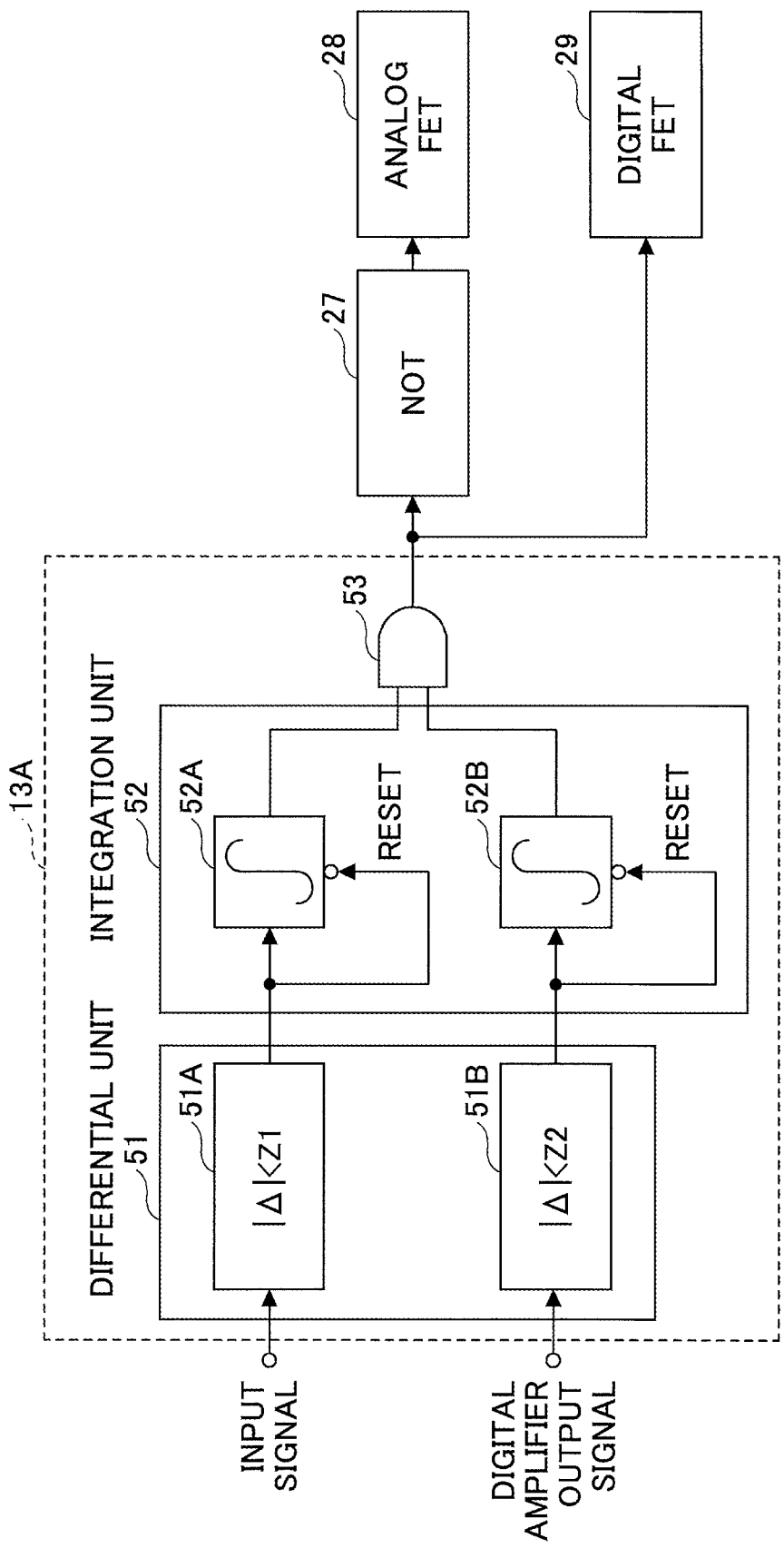
FIG. 7 is a drawing illustrating an example of the configuration of a frequency check unit.

FIG. 7 is a drawing illustrating an example of the configuration of the frequency check unit 13A. In FIG. 7, the same or corresponding elements as those of FIG. 1 and FIG. 6 are referred to by the same or corresponding numerals, and a description thereof will be omitted as appropriate. The frequency check unit 13A includes a differential unit 51, an integration unit 52, and an AND gate 53. A NOT unit 27, an analog FET 28, and a digital FET 29 correspond to the inverter 27, the NMOS transistor 28, and the NMOS transistor 29, respectively, illustrated in FIG. 1 and FIG. 6.

The differential unit 51 includes a differential circuit 51A and a differential circuit 51B. The differential circuit 51A receives the input signal into the amplifier circuit 10A, and obtains a differential value Δ thereof, followed by generating the first check result indicative of whether the absolute value of the differential value Δ is smaller than a predetermined value Z1. The first check result is set to HIGH in the case of the absolute value Δ of the differential value being smaller than the predetermined value Z1, and is set to LOW otherwise. The differential circuit 51B receives the output signal of the digital amplifier 12, and obtains a differential value Δ thereof, followed by generating the second check result indicative of whether the absolute value of the differential value Δ is smaller than a predetermined value Z2. The second check result is set to HIGH in the case of the absolute value Δ of the differential value being smaller than the predetermined value Z2, and is set to LOW otherwise.

The integration unit 52 checks whether the HIGH first check result indicative of the fact that the absolute value of the differential value of the input signal is smaller than the predetermined value Z1 and the HIGH second check result indicative of the fact that the absolute value of the differential value of the first output signal is smaller than the predetermined value Z2 continues more than a predetermined time length. The integration unit 52 includes an integration circuit 52A and an integration circuit 52B. The integration circuit 52A sets an output thereof to HIGH when the HIGH state of the first check result indicative of the fact that the absolute value of the differential value of the input signal is smaller than the predetermined value Z1 continues more than the predetermined time length. In the case of the absolute value of the differential value of the input signal being not smaller than the predetermined value Z1, the integration circuit 52A is reset, and the output thereof is set to LOW. The integration circuit 52B sets an output thereof to HIGH when the HIGH state of the second check result indicative of the fact that the absolute value of the differential value of the first output signal from the digital amplifier 12 is smaller than the predetermined value Z2 continues more than the predetermined time length. In the case of the absolute value of the differential value of the first output signal being not smaller than the predetermined value Z2, the integration circuit 52B is reset, and the output thereof is set to LOW.

The AND gate 53 produces a HIGH output when both the output of the integration circuit 52A and the output of the integration circuit 52B are HIGH. This HIGH output is supplied as the output of the frequency check unit 13A to the selector circuit 14 (i.e., the NOT unit 27, the analog FET 28, and the digital FET 29). In the case of the output of the frequency check unit 13A being HIGH, the NMOS transistor 28 for the analog amplifier 11 becomes nonconductive, and the NMOS transistor 29 for the digital amplifier 12 becomes conductive, thereby selecting and outputting the output signal of the digital amplifier 12.

Figure 8:
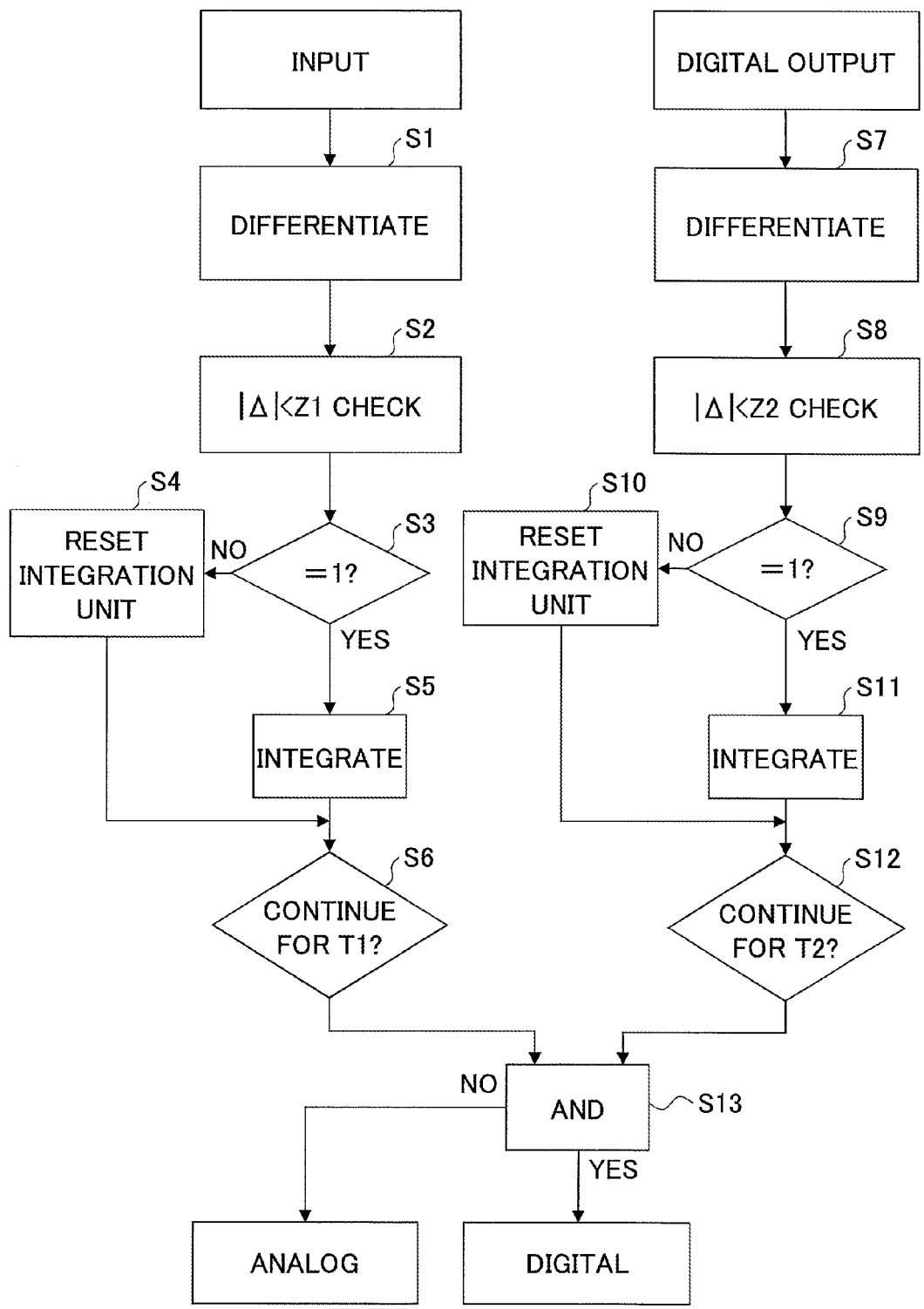
FIG. 8 is a flowchart illustrating the operation sequence of the frequency check unit.

FIG. 8 is a flowchart illustrating the operation sequence of the frequency check unit 13A. In step S1, the input signal is differentiated. In step S2, a check value indicative of whether the absolute value of the differential value is smaller than Z1 is obtained. In step S3, a check is made as to whether the check value is true (i.e., "1"). In the case of the check value being not true (i.e., "1"), that is, in the case of the absolute value of the differential value being not smaller than Z1, the integration circuit 52A is reset in step S4. In the case of the check value being true (i.e., "1"), that is, in the case of the absolute value of the differential value being smaller than Z1, the check value "1" is integrated in step S5 (i.e., the value "1" obtained this time is added to the cumulative value of the previous "1"s). In step S6, a check is made as to whether the condition that the check result is true (i.e., "1") has continued more than a predetermined time length T1. To be more specific, a check is made as to whether the result of integration (i.e., the cumulative value) has reached a predetermined value (i.e., T1/ΔT in the case of the sampling interval being ΔT). In the case of the result of integration has reached a predetermined value corresponding to the predetermined time length T1, the check result is set to "true" (i.e., "1"). Otherwise the check result is set to "false" (i.e., "0").

Concurrently with the above-noted operation, the first output signal of the digital amplifier 12 is differentiated in step S7. In step S8, a check value indicative of whether the absolute value of the differential value is smaller than Z2 is obtained. In step S9, a check is made as to whether the check value is true (i.e., "1"). In the case of the check value being not true (i.e., "1"), that is, in the case of the absolute value of the differential value being not smaller than Z2, the integration circuit 52B is reset in step S10. In the case of the check value being true (i.e., "1"), that is, in the case of the absolute value of the differential value being smaller than Z2, the check value "1" is integrated in step S11 (i.e., the value "1" obtained this time is added to the cumulative value of the previous "1"s). In step S12, a check is made as to whether the condition that the check result is true (i.e., "1") has continued more than a predetermined time length T1. To be more specific, a check is made as to whether the result of integration (i.e., the cumulative value) has reached a predetermined value (i.e., T1/ΔT in the case of the sampling interval being ΔT). In the case of the result of integration has reached a predetermined value corresponding to the predetermined time length T1, the check result is set to "true" (i.e., "1"). Otherwise the check result is set to "false" (i.e., "0").

In step S13 that is the last step, an AND operation is performed between the check result obtained in step S6 and the check result obtained in step S12. In the case of the result of the AND operation being true (i.e., "1"), the first output signal of the digital amplifier 12 is selected. In the case of the result of the AND operation being false (i.e., "0"), the second output signal of the analog amplifier 11 is selected. Thereafter, the above-noted processes are repeated.

Figure 9:
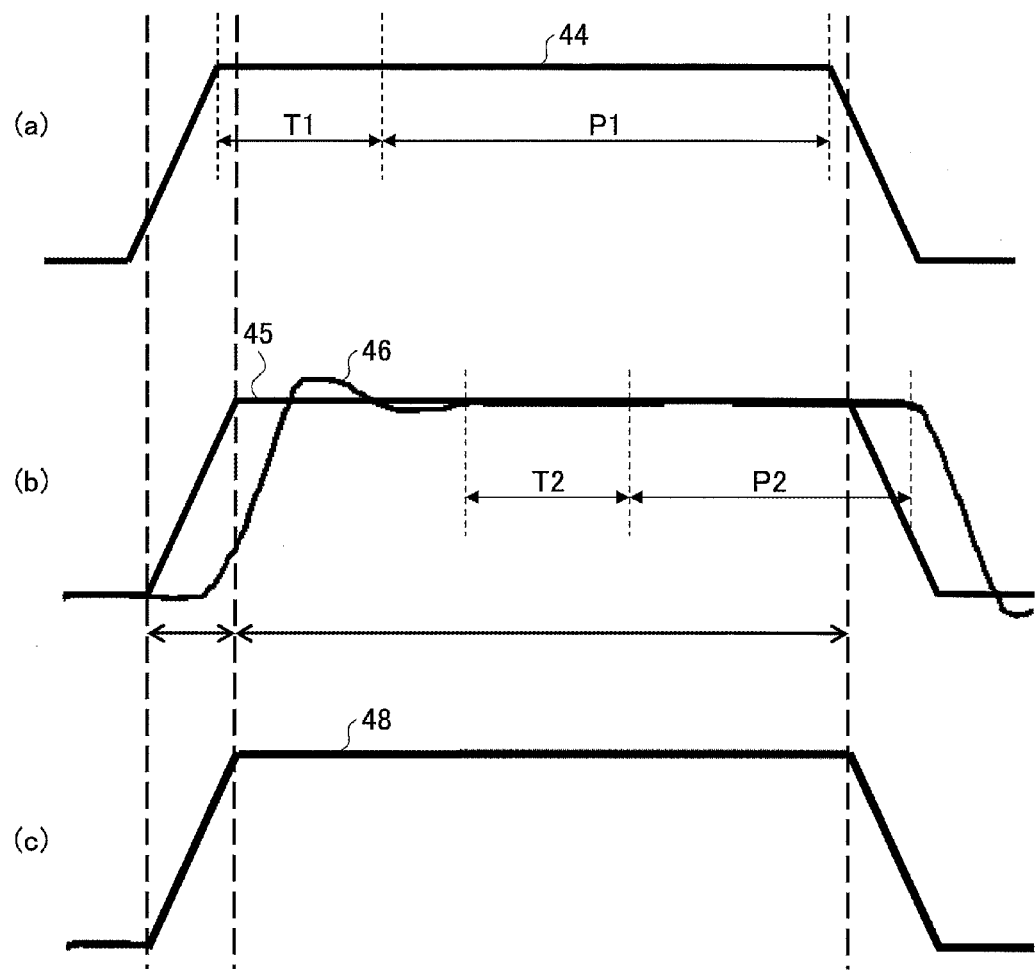
FIG. 9 is a drawing illustrating the switching of outputs of the amplifier circuit illustrated in FIG. 6.

FIG. 9 is a drawing illustrating the switching of outputs of the amplifier circuit 10A illustrated in FIG. 6. In FIG. 9, the horizontal axis represents time, and the vertical axis represents the amplitude of an input signal or an output signal. In FIG. 9, the same or corresponding parts as those of FIG. 5 are referred to by the same or corresponding numerals, and a description thereof will be omitted as appropriate.

FIG. 9-(a) illustrates an input signal 44. FIG. 5-(b) illustrates a second output signal 45 produced by the analog amplifier 11 in response to the input signal 44 and a first output signal 46 produced by the digital amplifier 12 in response to the input signal 44.

The period of the HIGH output of the differential circuit 51A illustrated in FIG. 7 includes both a period T1 and a period P1 illustrated in FIG. 9-(a). Upon the passage of the predetermined time length T1 following the change to HIGH of the output of the differential circuit 51A, the output of the integration circuit 52A becomes HIGH. The period P1 illustrated in FIG. 9-(a) corresponds to the period of this HIGH output of the integration circuit 52A.

The period of the HIGH output of the differential circuit 51B illustrated in FIG. 7 includes both a period T2 and a period P2 illustrated in FIG. 9-(b). Upon the passage of the predetermined time length T2 following the change to HIGH of the output of the differential circuit 51B, the output of the integration circuit 52B becomes HIGH. The period P2 illustrated in FIG. 9-(b) corresponds to the period of this HIGH output of the integration circuit 52B.

During the overlapping period between the period P1 and the period P2, the output of the frequency check unit 13A becomes HIGH, thereby selecting the first output signal of the digital amplifier 12. In other periods (excluding the period in which the input signal 44 is fixed to LOW), the second output signal of the analog amplifier 11 is selected. As a result, the output signal waveform of the amplifier circuit 10A becomes a waveform 48 illustrated in FIG. 9-(c).

When the amplifier outputs are switched over in response to local signal changes, the output signal ends up being a discontinuous waveform as illustrated in FIG. 4 and FIG. 5. In consideration of this, the frequency check unit 13A of the amplifier circuit 10A illustrated in FIG. 6 checks whether the condition that the absolute value of the differential value of the input signal is smaller than the predetermined value continues more than the predetermined time length T1. With this arrangement, switching to the digital output does not occur during the period T1 illustrated in FIG. 9-(a). It may be noted that if the check as to the switching of outputs is made only based on the input signal, a switch to the digital output occurs immediately upon the end of the period T1. At the end of the period T1, however, the digital output signal 46 is still in the transient response state as illustrated in FIG. 9-(b), so that the switching of outputs at this point in time may end up creating discontinuity in the output signal waveform. In consideration of this, the frequency check unit 13A of the amplifier circuit 10A illustrated in FIG. 6 checks whether the condition that the absolute value of the differential value of the output signal of the digital amplifier 12 is smaller than the predetermined value continues more than the predetermined time length T2. Based on this check, switching to the digital output during the period P2 is performed upon the passage of the period T2 following the disappearance of any sudden change in the output signal of the digital amplifier 12. In this manner, both the input signal and the output signal of the digital amplifier 12 are used to reliably avoid discontinuity in the output signal waveform Use of only the digital output would end up using the end of the period P2 as the time to switch from the digital output to the analog output in the example illustrated in FIG. 9-(b), thereby resulting in the occurrence of a discontinuous point. Use of both the input signal and the digital signal is thus preferable.

Figure 10:
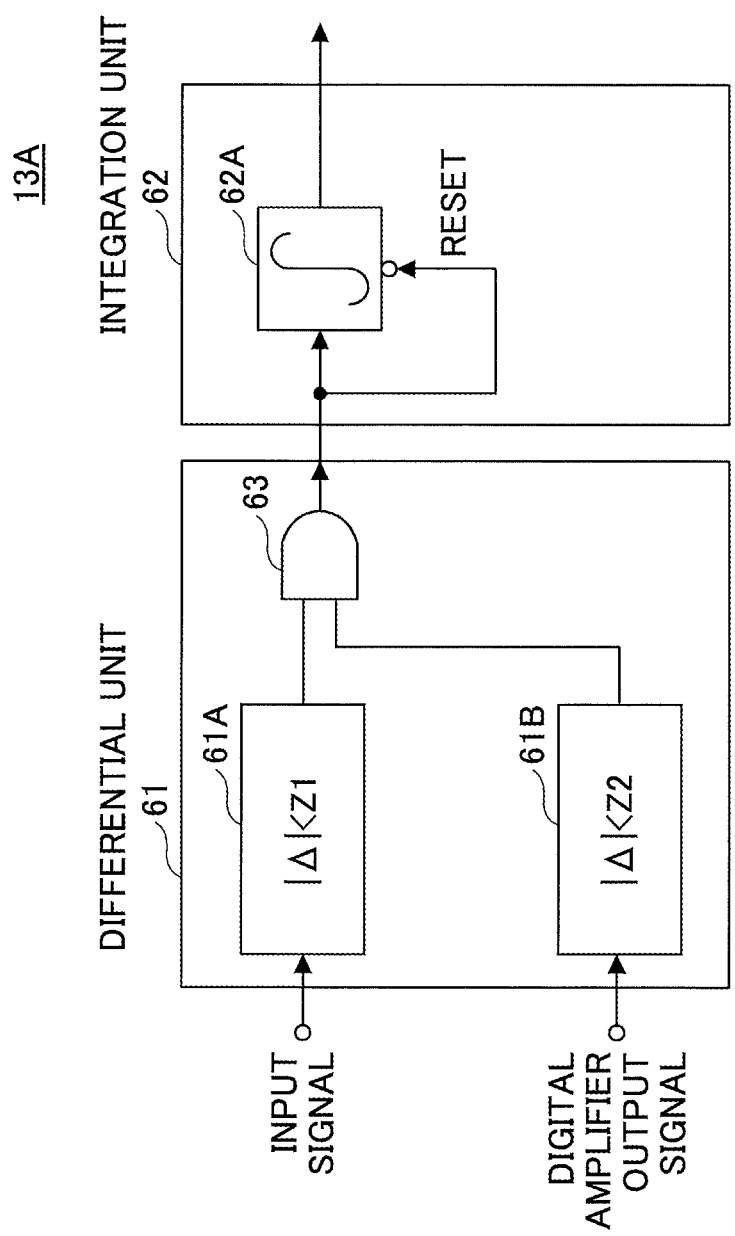
FIG. 10 is a drawing illustrating a variation of the frequency check unit.

FIG. 10 is a drawing illustrating a variation of the frequency check unit 13A. The frequency check unit 13A illustrated in FIG. 10 includes a differential unit 61, an integration unit 62, and an AND gate 63. The differential unit 61 includes a differential circuit 61A and a differential circuit 61B. The differential circuit 61A receives the input signal into the amplifier circuit 10A, and obtains a differential value Δ thereof, followed by generating the first check result indicative of whether the absolute value of the differential value Δ is smaller than a predetermined value Z1. The first check result is set to HIGH in the case of the absolute value Δ of the differential value being smaller than the predetermined value Z1, and is set to LOW otherwise. The differential circuit 61B receives the output signal of the digital amplifier 12, and obtains a differential value Δ thereof, followed by generating the second check result indicative of whether the absolute value of the differential value Δ is smaller than a predetermined value Z2. The second check result is set to HIGH in the case of the absolute value Δ of the differential value being smaller than the predetermined value Z2, and is set to LOW otherwise. The AND gate 63 produces a HIGH output when both the output of the differential circuit 61A and the output of the differential circuit 61B are HIGH. The output of the AND gate 63 becomes HIGH in response to the simultaneous occurrence of the condition that the first check result indicates that the absolute value of the differential value of the input signal is smaller than the predetermined value Z1 and the condition that the second check result indicates that the absolute value of the differential value of the first output signal is smaller than the predetermined value Z2.

The integration unit 62 checks whether the HIGH output of the AND gate 63 continues more than a predetermined time length. The AND gate 63 includes an integration circuit 62A. The integration circuit 62A produces a HIGH output when the HIGH output of the AND gate 63 continues more than the predetermined time length. In the case of the output of the AND gate 63 being not HIGH, the integration circuit 62A is reset, and the output of the integration circuit 62A is set to LOW. The output of the integration circuit 62A serves as the output of the frequency check unit 13A. In the case of the output of the frequency check unit 13A being HIGH, the NMOS transistor 28 for the analog amplifier 11 becomes nonconductive, and the NMOS transistor 29 for the digital amplifier 12 becomes conductive, thereby selecting and outputting the output signal of the digital amplifier 12.

Figure 11:
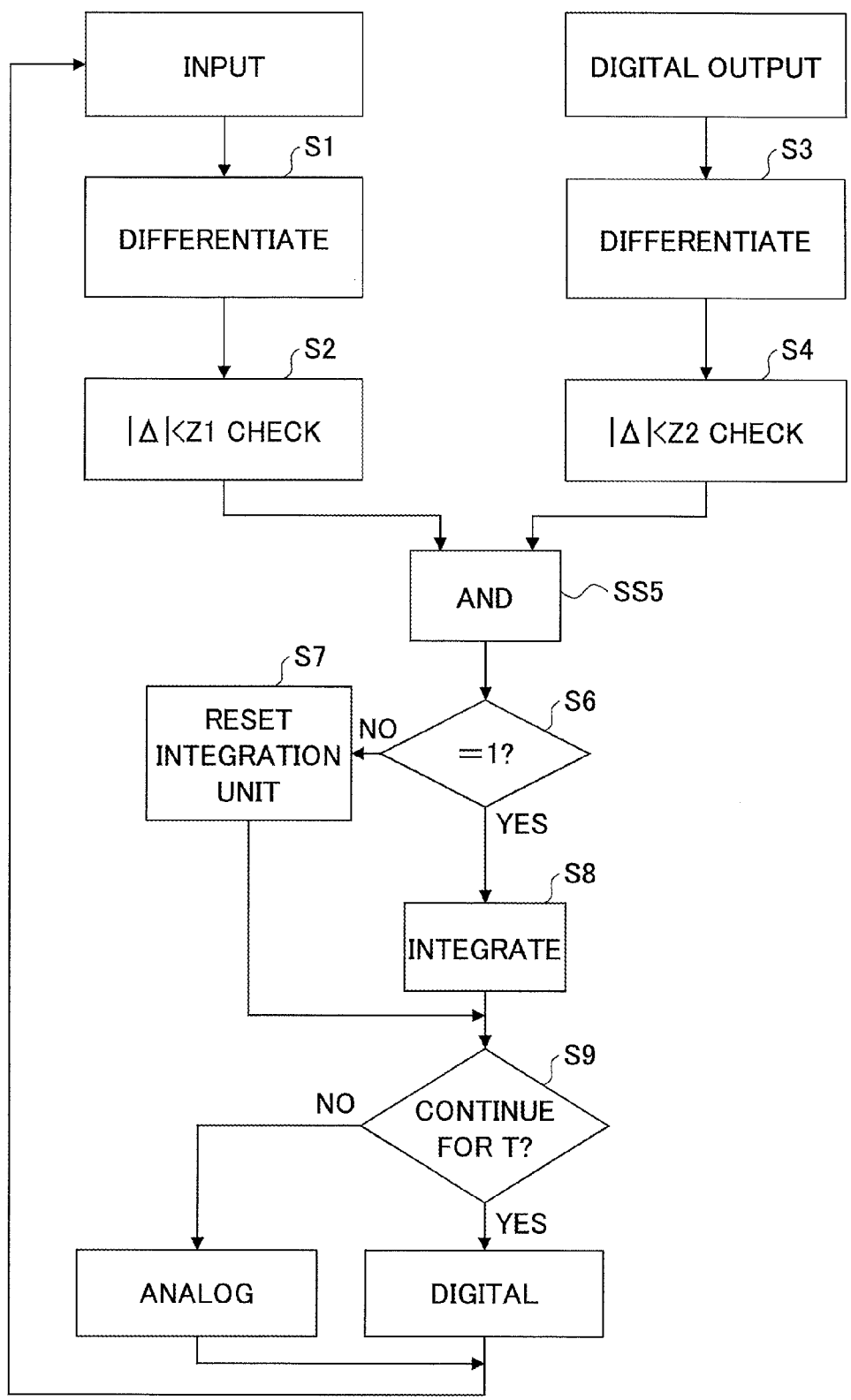
FIG. 11 is a flowchart illustrating the operation sequence of the frequency check unit illustrated in FIG. 10.

FIG. 11 is a flowchart illustrating the operation sequence of the frequency check unit 13A illustrated in FIG. 10. In step S1, the input signal is differentiated. In step S2, a check value indicative of whether the absolute value of the differential value is smaller than Z1 is obtained. Concurrently with the above-noted operation, the first output signal of the digital amplifier 12 is differentiated in step S3. In step S4, a check value indicative of whether the absolute value of the differential value is smaller than Z2 is obtained.

In step S5, an AND operation is performed between the check value obtained in step S2 and the check value obtained in step S4. In step S6, a check is made as to whether the check value obtained by the AND operation is true (i.e., "1"). In the case of the check value being not true (i.e., "1"), that is, in the case of at least one of the check value in step S2 and the check value in step S4 being "0", the integration circuit 62A is reset in step S7. In the case of the check value being true (i.e., "1"), that is, in the case of both the check value in step S2 and the check value in step S4 being "1", the check value "1" is integrated in step S8 (i.e., "1" obtained this time is added to the cumulative value of the previous "1"s). In step S9, a check is made as to whether the condition that the check result is true (i.e., "1") has continued more than a predetermined time length T. To be more specific, a check is made as to whether the result of integration (i.e., the cumulative value) has reached a predetermined value (i.e., $T/\Delta T$ in the case of the sampling interval being $\Delta T$). In the case of the result of integration has reached a predetermined value corresponding to the predetermined time length T, the check result is set to "YES". Otherwise the check result is set to "NO". In the case of the check result being "YES", the first output signal of the digital amplifier 12 is selected. In the case of the check result being "NO", the second output signal of the analog amplifier 11 is selected. Thereafter, the above-noted processes are repeated.

In the frequency check unit 13A illustrated in FIG. 10 and FIG. 11, the check result regarding the input signal and the check result regarding the first output signal of the digital amplifier 12 are subjected to an AND operation prior to integration. In this case, switching to the digital amplifier output is performed upon the passage of a sufficiently long time following the disappearance of any sudden change in both the input signal and the output signal of the digital amplifier, thereby eliminating a discontinuous change in the output waveform.

Figure 12A:
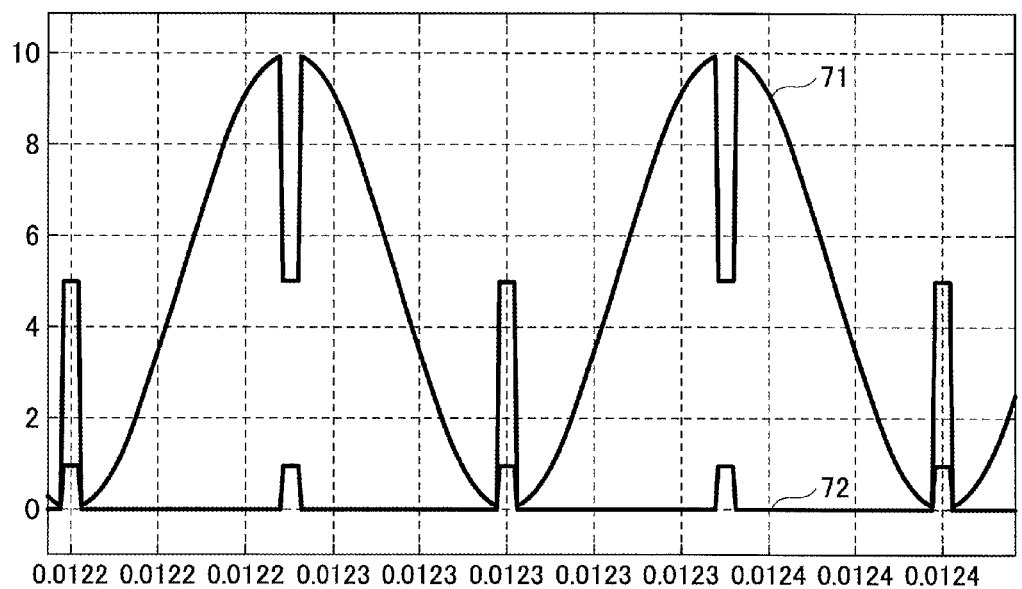
FIGS. 12A and 12B are drawings illustrating the results of computer simulation.
Figure 12B:
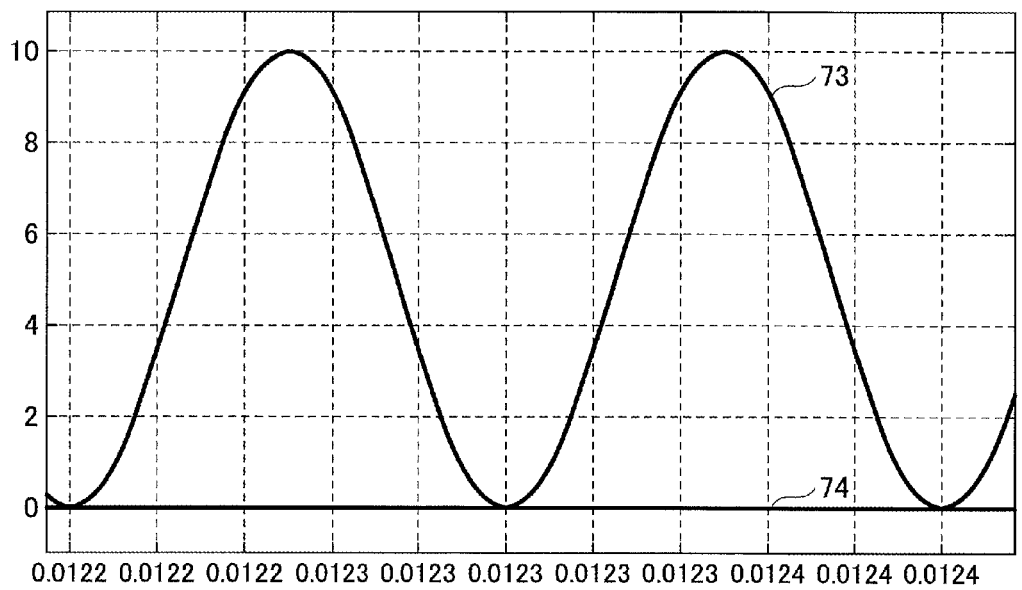

FIGS. 12A and 12B are drawings illustrating the results of computer simulation. In this computer simulation, the input signal was a sinusoidal wave having a frequency of 10 kHz. The sampling frequency was 2 MHz. The cutoff frequency of the low-pass filter 25 illustrated in FIG. 1 or FIG. 6 was 1 kHz. In FIGS. 12A and 12B, the horizontal axis represents time, and the vertical axis represents a signal value.

FIG. 12A illustrates an output waveform 71 of the amplifier circuit 10 illustrated in FIG. 1, and a check signal 72 output from the frequency check unit 13. The check signal 72 becomes HIGH around the positive and negative peaks of the sinusoidal wave, so that the output of the digital amplifier is selected only around the positive and negative peaks of the sinusoidal wave. In other places, the output of the analog amplifier is selected. As a result, the output waveform 71 of the amplifier circuit 10 becomes a discontinuous waveform as illustrated.

FIG. 12B illustrates an output waveform 73 of the amplifier circuit 10A illustrated in FIG. 6, and a check signal 74 output from the frequency check unit 13A. The check signal 74 is set to LOW all the time, so that the analog amplifier output is selected all the time. As a result, the output waveform 73 of the amplifier circuit 10A becomes a continuous sinusoidal waveform as illustrated.

Figure 13:
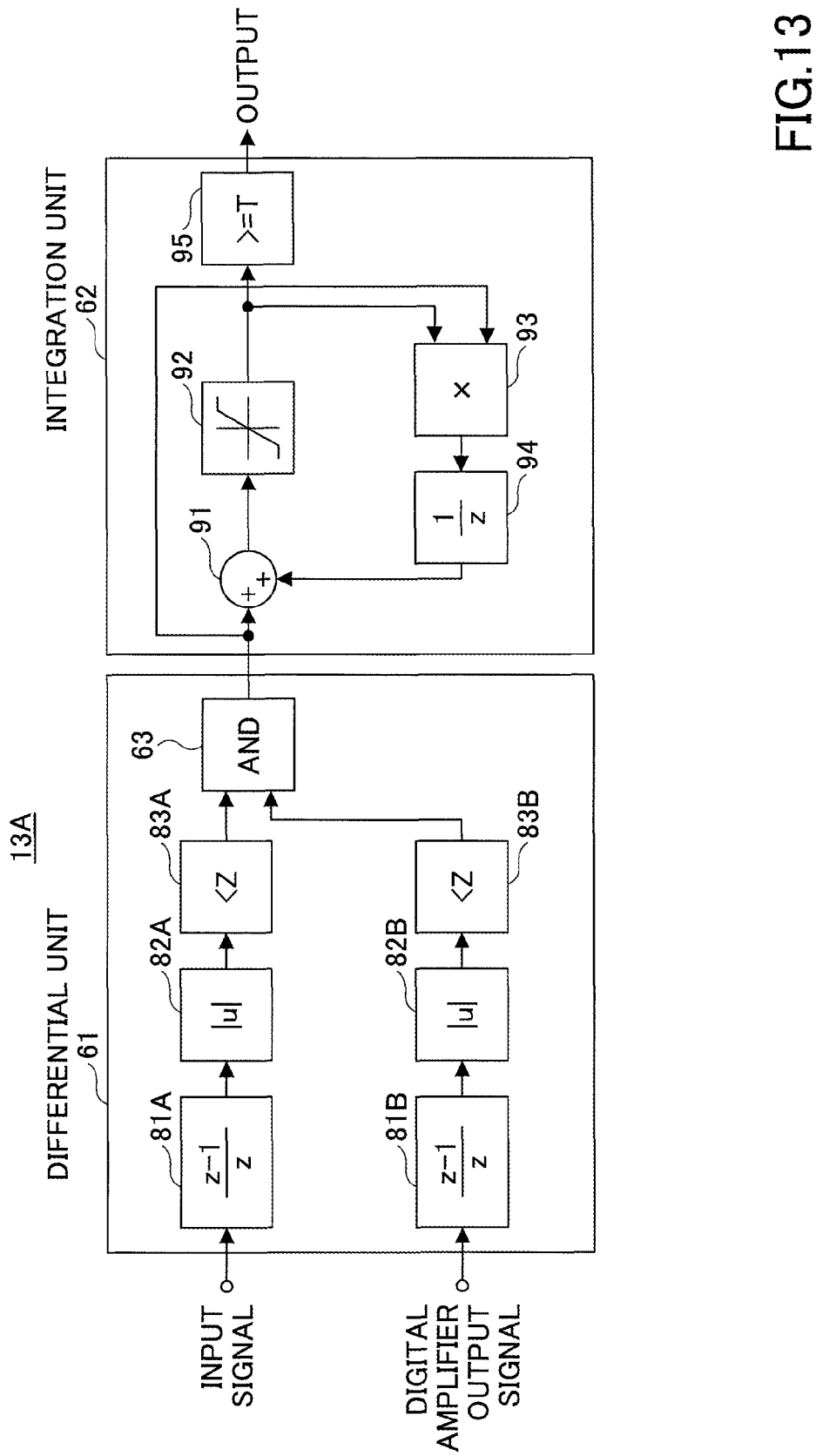
FIG. 13 is a drawing illustrating an example of the circuit configuration of the frequency check unit illustrated in FIG. 10.

FIG. 13 is a drawing illustrating an example of the circuit configuration of the frequency check unit 13A illustrated in FIG. 10. In FIG. 13, the same or corresponding elements as those of FIG. 10 are referred to by the same or corresponding numerals, and a description thereof will be omitted as appropriate. The frequency check unit 13A includes the differential unit 61 and the integration unit 62. The differential unit 61 includes differential circuits 81A and 81B, absolute-value circuits 82A and 82B, comparison circuits 83A and 83B, and the AND gate 63. The integration unit 62 includes an addition circuit 91, a saturation circuit 92, a multiplication circuit 93, a delay circuit 94, and a comparison circuit 95. Expressions including "z" illustrated in FIG. 13 are represented by use of z-transform notations.

The differential circuit 81A obtains a differential value between two adjacent sample points of the input signal. The absolute-value circuit 82A obtains the absolute value of a differential value u obtained by the differential circuit 81A. The comparison circuit 83A compares the absolute value obtained by the absolute-value circuit 82A with a reference value Z (to be more specific, a predetermined value Z1). The comparison circuit 83A outputs HIGH when the absolute value is smaller than the reference value Z, and outputs LOW when the absolute value is larger than the reference value Z. The differential circuit 81B obtains a differential value between two adjacent sample points of the output signal of the digital amplifier 12. The absolute-value circuit 82B obtains the absolute value of a differential value u obtained by the differential circuit 81B. The comparison circuit 83B compares the absolute value obtained by the absolute-value circuit 82B with a reference value Z (to be more specific, a predetermined value Z2). The comparison circuit 83B outputs HIGH when the absolute value is smaller than the reference value Z, and outputs LOW when the absolute value is larger than the reference value Z. The AND gate 63 produces a HIGH output when both the output of the comparison circuit 83A and the output of the comparison circuit 83B are HIGH.

The addition circuit 91 of the integration unit 62 adds the current output of the differential unit 61 to the cumulative value of the previous outputs of the differential unit 61, thereby updating the cumulative value. The saturation circuit 92 causes the cumulative value to saturate at a certain value greater than the predetermined value T, thereby avoiding an overflow of each circuit part in the integration unit 62. The multiplication circuit 93 multiplies the cumulative value output from the saturation circuit 92 by the current output of the differential unit 61, thereby resetting the cumulative value to zero when the current output of the differential unit 61 is "0". In the case of the current output of the differential unit 61 being "1", the multiplication circuit 93 outputs the current cumulative value. The delay circuit 94 supplies the cumulative value or the reset value "0" output from the multiplication circuit 93 to the addition circuit 91 after imposing a delay equal to one sampling interval. The comparison circuit 95 compares the cumulative value output from the saturation circuit with the predetermined value T corresponding to the predetermined time length, and outputs HIGH upon the cumulative value being greater than the predetermined value T. In the case of the cumulative value being smaller than the predetermined value T, the comparison circuit 95 outputs.

It may be noted that a unipolar output has been used in the description given heretofore. Nonetheless, a bipolar output is readily obtained by use of positive and negative power supplies and electronic relays (capable of a bipolar operation) for the elements 28 and 29.

According to at least one embodiment, the amplifier circuit can amplify a varying input voltage efficiently in such a manner as to achieve fast response characteristics All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An amplifier circuit, comprising:
   a digital amplifier configured to amplify an input signal to output a first output signal;
   an analog amplifier configured to amplify the input signal to output a second output signal;
   a check circuit configured to produce a check signal responsive to frequencies of the input signal; and
   a selector circuit configured to select and output one of the first output signal and the second output signal in response to the check signal.

2. The amplifier circuit as claimed in claim 1, wherein the check circuit is configured to produce the check signal in response to the input signal and the first output signal.

3. The amplifier circuit as claimed in claim 1, wherein the check circuit is configured to obtain a differential value of the input signal and to check whether an absolute value of the differential value is smaller than a predetermined value.

4. The amplifier circuit as claimed in claim 1, wherein the check circuit is configured to produce the check signal based on a first check result indicative of whether an absolute value of a differential value of the input signal is smaller than a predetermined value and a second check result indicative of whether an absolute value of a differential value of the first output signal is smaller than a predetermined value.

5. The amplifier circuit as claimed in claim 4, wherein the check circuit is configured to produce the check signal causing the selector circuit to select the first output signal when the first check result indicating that an absolute value of a differential value of the input signal is smaller than a predetermined value and the second check result indicating that an absolute value of a differential value of the first output signal is smaller than a predetermined value continue more than a predetermined time length.

6. The amplifier circuit as claimed in claim 5, wherein the check circuit is configured to produce the check signal causing the selector circuit to select the first output signal upon a simultaneous occurrence of an event that the first check result indicating that an absolute value of a differential value of the input signal is smaller than a predetermined value continues more than a predetermined time length and an event that the second check result indicating that an absolute value of a differential value of the first output signal is smaller than a predetermined value continues more than a predetermined time length.

7. The amplifier circuit as claimed in claim 5, wherein the check circuit is configured to produce the check signal causing the selector circuit to select the first output signal when a simultaneous occurrence of two events continues more than a predetermined time length, the events including an event that the first check result indicates that an absolute value of a differential value of the input signal is smaller than a predetermined value and an event that the second check result indicates that an absolute value of a differential value of the first output signal is smaller than a predetermined value.

8. A method of generating an output of an amplifier circuit, which includes a digital amplifier amplifying an input signal to produce a first output signal and an analog amplifier amplifying the input signal to produce a second output signal, comprising:

generating a check signal responsive to frequencies of the input signal; and selecting, as the output of the amplifier circuit, one of the first output signal and the second output signal in response to the check signal.

9. The method as claimed in claim 8, wherein the generating the check signal generates the check signal based on a first check result indicative of whether an absolute value of a differential value of the input signal is smaller than a predetermined value and a second check result indicative of whether an absolute value of a differential value of the first output signal is smaller than a predetermined value.

* * * * *